United States Patent [19]
Satoh et al.

[11] Patent Number: 6,113,704
[45] Date of Patent: Sep. 5, 2000

[54] SUBSTRATE-SUPPORTING DEVICE FOR SEMICONDUCTOR PROCESSING

[75] Inventors: Kiyoshi Satoh; Mikio Shimizu, both of Tama, Japan

[73] Assignee: ASM Japan K.K., Tokyo, Japan

[21] Appl. No.: 09/346,172

[22] Filed: Jul. 1, 1999

[30] Foreign Application Priority Data

Jul. 1, 1998 [JP] Japan .................................. 10-186363

[51] Int. Cl.$^7$ .................................................. C23C 16/00
[52] U.S. Cl. .......................... 118/728; 118/724; 118/725; 156/345
[58] Field of Search ..................................... 118/728, 724, 118/725, 500, 723 R; 156/345; 204/298.15

[56] References Cited

U.S. PATENT DOCUMENTS 5,916,370  6/1999  Chang ...................................... 118/729
6,022,413  2/2000  Shinozano et al. ....................... 118/715
6,035,101  3/2000  Sajoto et al. .............................. 392/416

*Primary Examiner*—Benjamin L. Utech
*Assistant Examiner*—Luz Alejandro
*Attorney, Agent, or Firm*—Knobbe, Martens, Olson & Bear, LLP

[57] ABSTRACT

A supporting structure of a susceptor for semiconductor processing includes: (a) a plate having a carrying surface for placing a semiconductor substrate thereon, which plate has a back surface having a first coupling structure with a first pawl; and (b) a heating block for heating the semiconductor substrate, which heating block has an upper surface in contact with the back surface of the plate. The upper surface has a second coupling structure with a second pawl corresponding to the first coupling structure with the first pawl. A coupler may be used for placing the first pawl and the second pawl in pressure contact to couple the plate and the heating block.

23 Claims, 12 Drawing Sheets

SUBSTRATE-SUPPORTING DEVICE FOR SEMICONDUCTOR PROCESSING

Background of the Invention

1. Field of the Invention

This invention relates to a substrate-supporting device to support a semiconductor substrate within a semiconductor-processing device and, in particular, to the structure of a susceptor device that supports a substrate within plasma CVD equipment.

2. Description of the Related Art

FIG. 1 schematically illustrates conventional plasma CVD equipment. Former plasma CVD equipment comprises a reaction chamber (2), a showerhead (5) connected to a radio frequency oscillator (7), a susceptor (3) carrying semiconductor substrates (10), a heating block (4) within which a heating element (11) is embedded, and an exhaust port (9) connected to a vacuum pump (not shown). Flow-controlled reaction gas is introduced from a gas intake port (6) to the showerhead (5) and flows toward an oncoming semiconductor substrate. The inside of the reaction chamber (2) is maintained at a fixed pressure by a vacuum pump. In addition, the temperature of semiconductor substrates placed on the susceptor (3) is detected by a thermo-couple (12) and is maintained at a fixed temperature with a temperature controller (8). The susceptor (3) is electrically grounded (13) through the heating block, and forms one side of a radio frequency grounded electrode. Thus, a radio frequency plasma electrical discharge is generated in the reaction space between the showerhead (5) and the susceptor (3), reaction gas molecules are ionized and change to plasma near the upper part of the semiconductor substrate (10). As a result, active ion molecules adhere to the semiconductor substrate surface to form a thin film.

Incidentally, susceptors used for the plasma CVD equipment are roughly divided into two types. One type is a susceptor integrated with a reaction chamber or a heater, and another is a susceptor and a heating block which are unintegrated and secured together tightly with a bolt.

An example of the former, as stated in U.S. Pat. No. 5,039,388, is a susceptor comprised of aluminum or aluminum alloy with an anodized surface, which is manufactured as an integrated part with a heater. In addition, there is another type for which a heating part and a substrate-supporting part are manufactured in an integrated structure by embedding both the electrode and the heater wire in aluminum nitride.

As an example of the latter, a susceptor and a heating block are secured tightly together by fastening the susceptor over the heating block with bolts, wherein female screws are formed in the heating block and the bolts are screwed in the female screws through the susceptor. The bolt used here is comprised of Inconel, nickel and stainless steel, which are excellent in heat resistance and corrosion resistance. In addition, as stated in U.S. Pat. No. 5,633,073, there is a susceptor with a structure that uses a metal layer such as molybdenum embedded in an aluminum nitride substrate, which is a ceramic material, as a radio frequency grounded electrode, and wherein the back of the electrode is thread-cut as a female screw to secure the susceptor tightly to a reaction chamber with a metal screw.

However, the susceptors mentioned above have the following drawbacks:

First of all, in the case of aluminum with an anodized surface, it is excellent in resistance to plasma etching, but there is a possibility that a crack may develop on the susceptor surface because of changes caused by the passing of time. To prevent contamination from impurities, cleaning maintenance must be conducted regularly by dismantling the susceptor.

In this case, for a susceptor integrated with a reaction chamber and a susceptor integrated with a heater, it takes quite a lot of working hours, hence the use of a device has to be suspended for long hours and this directly causes lowered productivity.

Also, in the case of another integrated type in which both the electrode and the heater wire are embedded in aluminum nitride, regular cleaning maintenance is required to prevent contaminants from entering from the outer environment, including when carrying a wafer substrate in and out, and it is unavoidable to suspend the use of a device for long hours and to lower productivity. In addition, the generally high manufacturing costs of these integrated susceptors are also problematic.

On the other hand, for the type where a susceptor and a heating block are secured tightly together with bolts, poor adherence may occur due to loosening of the bolts caused by thermal expansion and contraction. As a result, a problem such as deviation of the substrate temperature of a semiconductor substrate from the fixed temperature occurs, affecting process stability. Also, at the time of plasma etching, there is a possibility that bolts made of nickel alloy may corrode when directly exposed to a fluorine-active source. As a result, there is a risk that contaminants resulting from corrosion may cause impurity contamination.

Furthermore, for the type with a metal embedded in an aluminum nitride substrate, which is a ceramic material, and with its back secured tightly to a reaction chamber with screws, there is a risk that this structure may be broken due to different coefficients of thermal expansion between aluminum nitride and a nickel screw if secured too tightly. In addition, there are possibilities that an opening is damaged or a screw becomes loose when a metal screw cannot withstand repeated sudden heating.

SUMMARY OF THE INVENTION

Consequently, an objective of an embodiment of the present invention is to provide a substrate-supporting device with which a susceptor can be easily dismantled and remounted within a short time.

An objective of another embodiment of the present invention is to provide a substrate-supporting device which sustains no damage due to sudden changes in temperature and wherein no gapping occurs between a susceptor and a heating block.

An objective of an additional embodiment of the present invention is to provide a substrate-supporting device with which there is no concern about impurity contamination at the time of dismantling and remounting a susceptor.

An objective of a further embodiment of the present invention is to provide a substrate-supporting device with lower manufacturing costs.

To achieve the objects, a substrate-supporting device for semiconductor processing according to this invention comprises the following embodiments:

In an embodiment, a supporting structure of a susceptor for semiconductor processing comprises: (a) a plate having a carrying surface for placing a semiconductor substrate thereon, said plate having a back surface comprising at least one first coupling structure with a first pawl; and (b) a heating block for heating the semiconductor substrate, said heating block having an upper surface in contact with the back surface of the plate, said upper surface comprising at least one second coupling structure with a second pawl corresponding to said at least one first coupling structure with the first pawl, wherein said first pawl and said second pawl are in pressure contact to couple the plate and the heating block.

In another embodiment, each first coupling structure may be a recessed portion formed on the back surface of the plate, each first pawl may be formed in the recessed portion, each second coupling structure may be a recessed portion formed on the upper surface of the heating block, and each second pawl is formed in the recessed portion.

Although the first coupling structure and the second coupling structure can directly be engaged as with a screw fastener or a screw thread (i.e., without using other materials), a coupler can effectively be used for gripping each pair of the first pawl and the second pawl to couple the plate and the heating block. The coupler can be fixed in either the first coupling structure or the second coupling structure, and can have a hook for engaging the pawl of the other coupling structure. The hook can engage the pawl when inserting the hook into said other coupling structure to contact the plate and the heating block and then turning the plate.

In another embodiment, each first coupling structure is a protruding portion formed on the back surface of the plate, said protruding portion forms the first pawl, each second coupling structure is a recessed portion formed on the upper surface of the heating block, and each second pawl is formed in the recessed portion. As in the first-mentioned embodiment, a coupler can effectively be used for gripping each pair of the first pawl and the second pawl to couple the plate and the heating block. In the above, the coupler may be axially rotatable and may have two hooks to grip each pair of the first pawl and the second pawl.

In another embodiment, the above coupler further has a through-hole in the axial direction and is rotatably placed in the recessed portion of the second coupling structure, the plate has a through-hole aligned coaxially with said coupler, and the heating block has a through-hole aligned coaxially with said coupler, said structure further comprising a shaft passing through said through-hole of the plate, said through-hole of the coupler, and said through-hole of the heating block, said shaft having a head which seals off said through-hole of the plate. The coupler may be manually rotatable prior to placing the shaft through said through-hole of the plate.

In the present invention, the above structure can be adapted for a supporting device for supporting a semiconductor substrate for semiconductor processing as described below.

DETAILED DESCRIPTION OF THE PREFERRED EMBODIMENT

This invention is explained referring to the Figures in the following:

First Embodiment

A susceptor device to support a semiconductor substrate within a semiconductor-processing device according to an embodiment of this invention comprises a plate for placing the semiconductor substrate thereon, the surface of which is a substantially flat carrying surface and the back of which has at least one recessed portion with a pawl portion formed, a heating block used to heat the semiconductor substrate, which has an embedded heating element and has at least one recessed portion with a pawl portion formed on the surface, a coupling component that is inserted into the recessed portion of the plate or the heating block and is used to secure the pawl portion of the plate and the pawl portion of the heating block together tightly by gripping both, and a shielding material to accommodate the heating block, and the device is characterized by the back of the plate and the surface of the heating block being secured tightly by rotating the plate.

Figure 1:
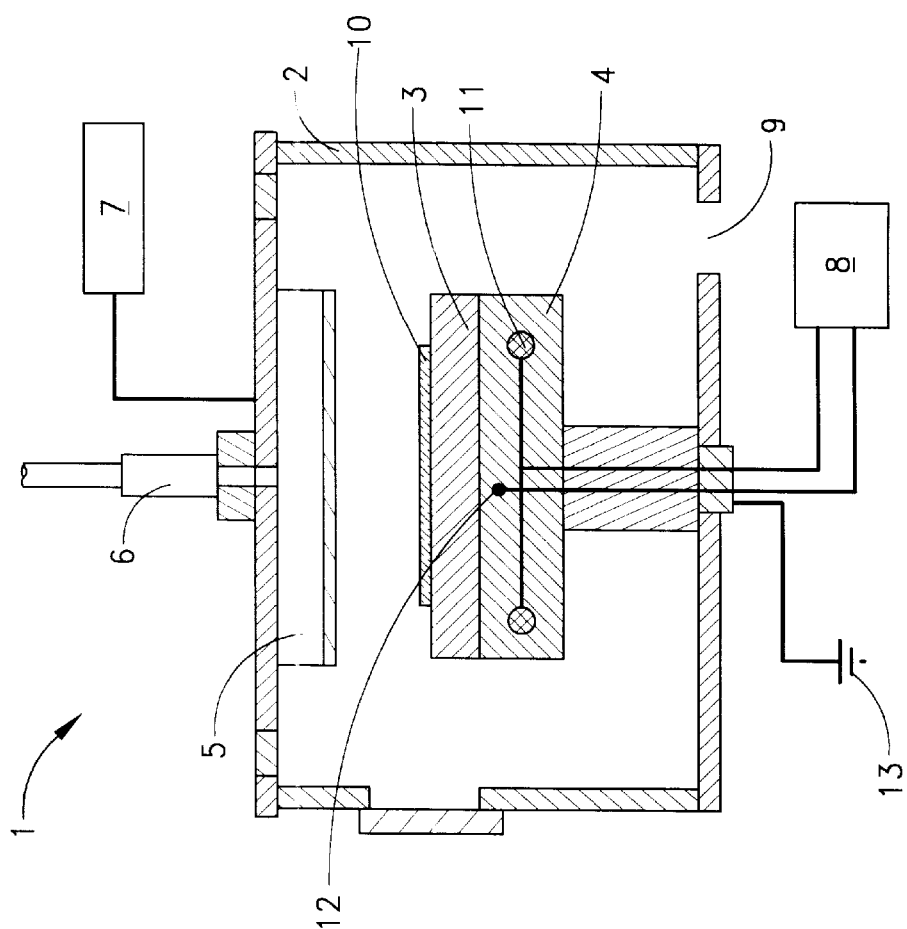
FIG. 1 is a sectional view schematically illustrating conventional plasma CVD equipment.
Figure 2A:
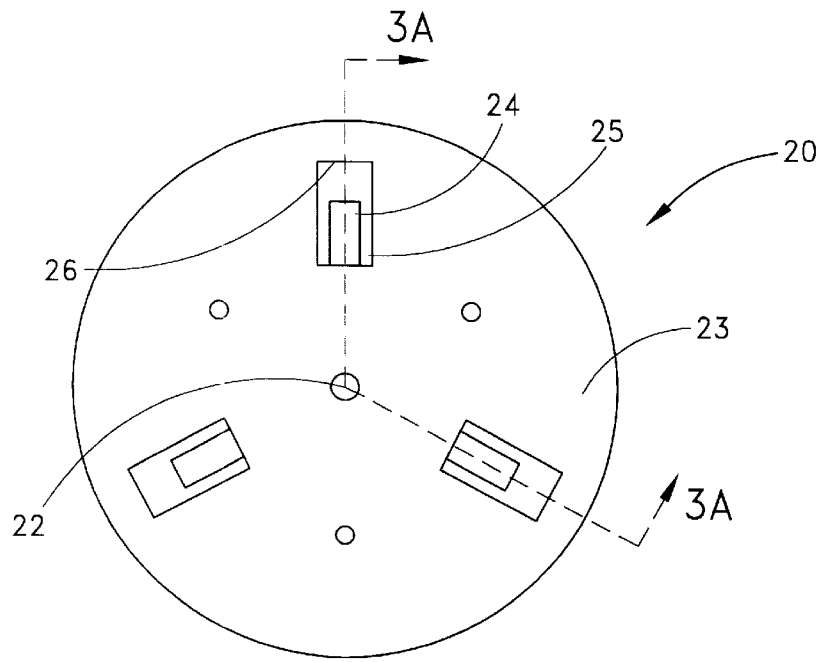
FIG. 2(A) is a plane view showing the back of a susceptor according to an embodiment of the present invention.

FIG. 2(A) illustrates the back of a plate (20) of a susceptor device according to an embodiment of the present invention.

A susceptor plate (20) comprises preferably a disc of 5 mm~20 mm thick comprised of an aluminum alloy. On the carrying surface of semiconductor substrate (38) of the plate (20) (See FIG. 3.), an anodized film of about 15 μm thick is formed. On the back surface (23) of the plate (20), three recessed portions (25) which are openings are provided at approximately even intervals radially, and from one end of each recessed portion (25), the pawl portion (24) extends parallel to the plate back surface. At the opposite end of the recess portion, the contacting surface (26) is provided at approximately right angles to the back surface of the plate. In addition, a center hole (22) fitting the centering pin (33) (See FIG. 3) used for alignment is provided at the center.

Here, each of the recessed portion and the pawl portion is drawn in a rectangular shape, but are not limited to it, and all other shapes including circles, ovals, and polygons can be used. In addition, the number of recessed portions is not limited to three and any number (e.g., 1, 2, 4, 5, or more) of recessed portions can be provided. 3 or more recessed portions are preferable.

Figure 2B:
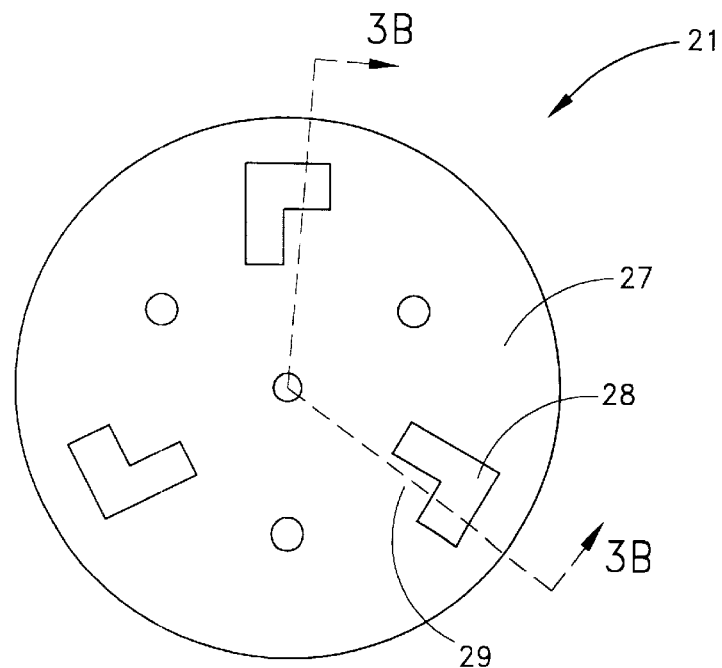
FIG. 2(B) is a bottom view showing the back of a heating block according to an embodiment of the present invention.

FIG. 2(B) illustrates the surface of a heating block (21) according to this invention. The heating block (21) is a columnar shape comprised of aluminum alloy, within which a heater (31) (See FIG. 3.) is embedded. On the surface (27) of the heating block (21), three recessed portions (28) which are openings are provided at approximately even intervals radially. From one corner within each recessed portion, a pawl portion (29) extends parallel to the surface (27) of the heating block (21). Here, the number and the disposition of recessed portions and pawl portions correspond to those of the susceptor plate (20).

Figure 3A:
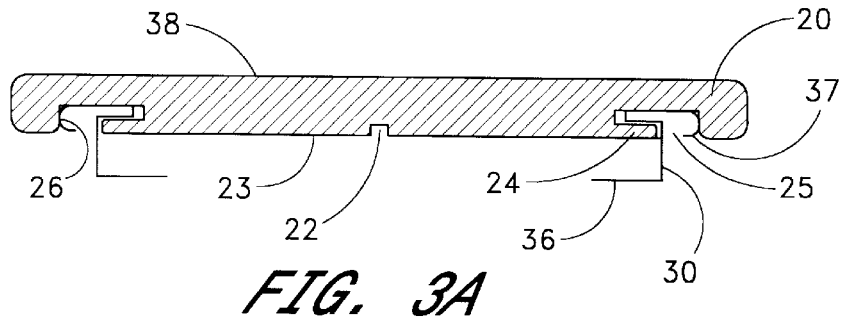
FIG. 3(A) is a sectional view showing a cross section of a plate used in a susceptor device according to an embodiment of the present invention.
Figure 3B:
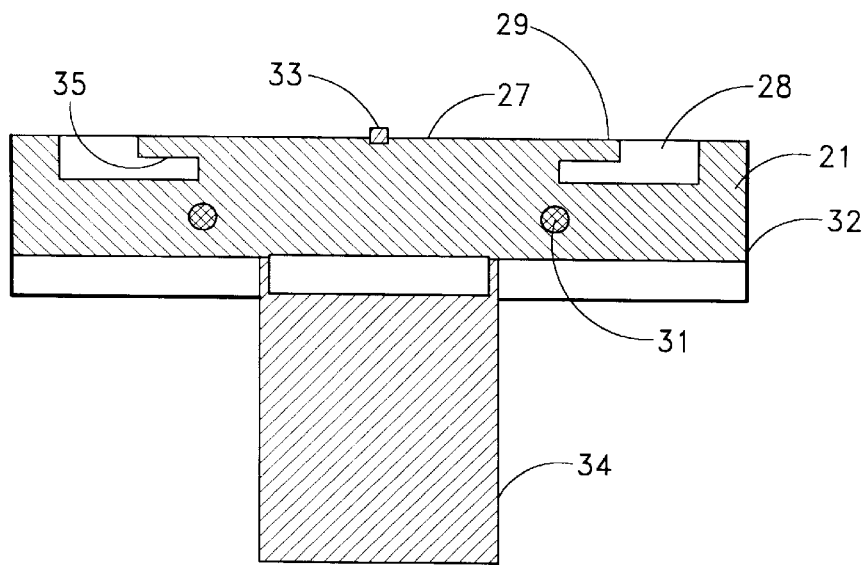
FIG. 3(B) is a sectional view showing a cross section of a heating block used in a susceptor device according to an embodiment of the present invention.

FIG. 3 schematically illustrates a cross section of a preferable implementation example of a susceptor device according to this invention. Figure (A) shows an A—A cross-section of FIG. 2(A) and FIG. 3(B) shows a B—B cross section of FIG. 2 (B). In FIG. 3(A), a coupling component (30) according to this embodiment of the present invention is inserted/connected to a recessed portion (25) of the susceptor plate (20). The coupling component (30) according to this embodiment has a substantially U-shaped clip structure and preferably it is made of a nickel (Ni) alloy containing chrome (Cr), but a material such as a cobalt-nickel (Co-Ni) alloy with excellent heat resistance and corrosion resistance can be used. The coupling component itself need not be elastic but may have a shape or structure allowing the component to be bendable or stretchable to place the pawl portions in pressure or friction contact. The coupling component can be in any shape so long as it can tightly couple the plate and the heating block by securing the pawl of the plate and the pawl of the heating block. Here, the shape of the coupling component (30) according to this embodiment is not limited to a substantially U-shape, but various shapes can be used. In addition, as explained later in FIG. 4, it can be inserted/connected to the recessed portion (28) on the heating side. The coupling component (30) has a curl (37) and prevents a gap in the horizontal direction from occurring by contacting the recessed portion (25) of the contacting surface (26). Moreover, the coupling component (30) concerned has a hook (36) parallel to the back surface (23) of the susceptor plate.

At the center of the heating block (21), a centering pin (33) is provided for alignment use. By fitting it into the center hole (22) of the susceptor plate (20), both are aligned. In addition, the heating block (21) is surrounded by a shielding material (32) comprised of aluminum alloy to prevent it from corrosion by etching gas, for example. Moreover, the heating block (21) and the shielding material (32) are supported by a supporting cabinet (34) comprised of the same aluminum alloy within a reaction chamber.

Figure 3C:
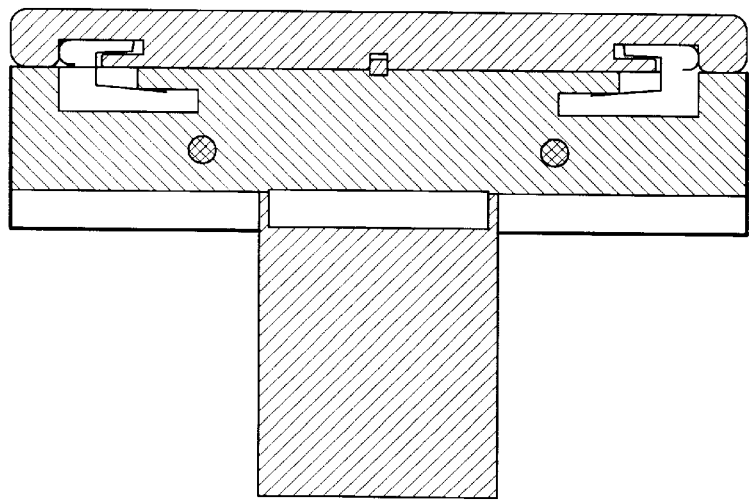
FIG. 3(C) is a sectional view showing a cross section of the plate of FIG. 3(A) and the heating block of FIG. 3(B) attached to each other.

FIG. 3(C) is a cross section illustrating how a susceptor plate (20) and a heating block (21) are linked by a coupling component (30). Coupling is executed by inserting the hook (36) of the coupling component (30) into the recessed portion (28) of a heating block (21), rotating the plate (20), and ally securing the hook on the undersurface (35) of the pawl portion (29) of the recessed portion (21) of the heating block (21). At the point when coupling is complete, the hook of each coupling component (30) is in a state where it is stretched nearly diagonally downward, and this ally pushes the undersurface (35) upward. Thus, the pawl portion (24) of the plate (20) and the pawl portion (29) of the heating block (21) are gripped by the coupling component (30), and the back surface (23) of the plate (20) and the surface (27) of the heating block (21) are secured tightly together by it.

When separating the plate (20) and the heating block (21), merely rotating the susceptor plate (20) in a direction opposite to the one taken when coupling it is required.

Variation of Coupling Component

Figure 4A:
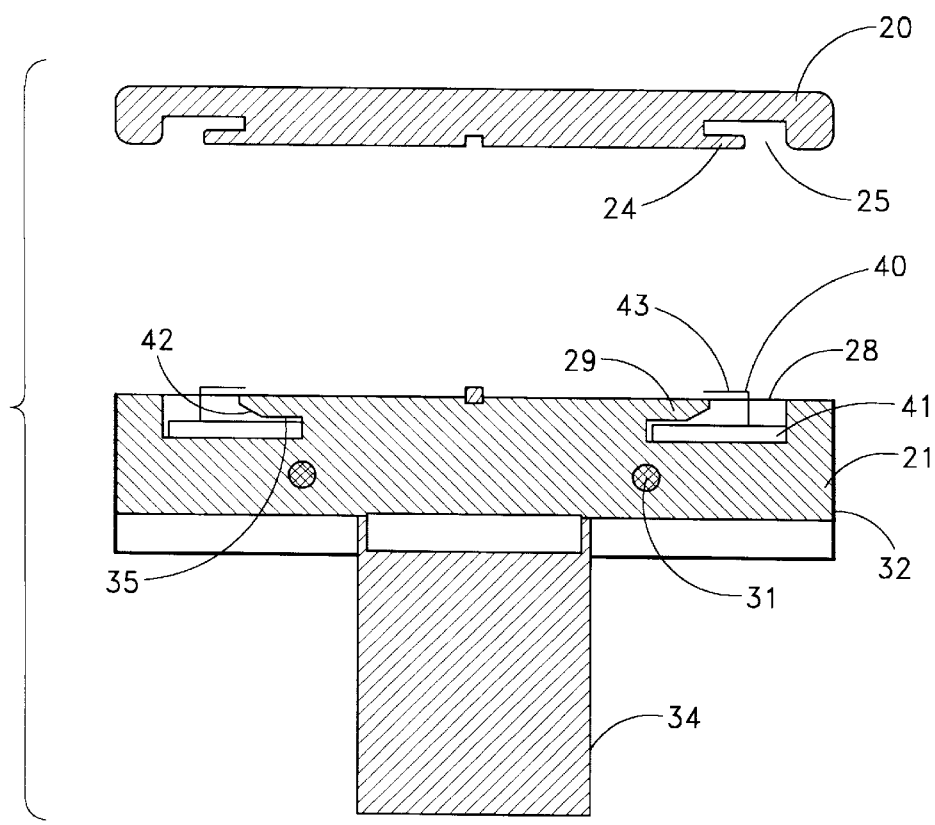
FIG. 4(A) is a sectional view showing a cross section of another type coupling component of a susceptor device according to an embodiment of the present invention.
Figure 4B:
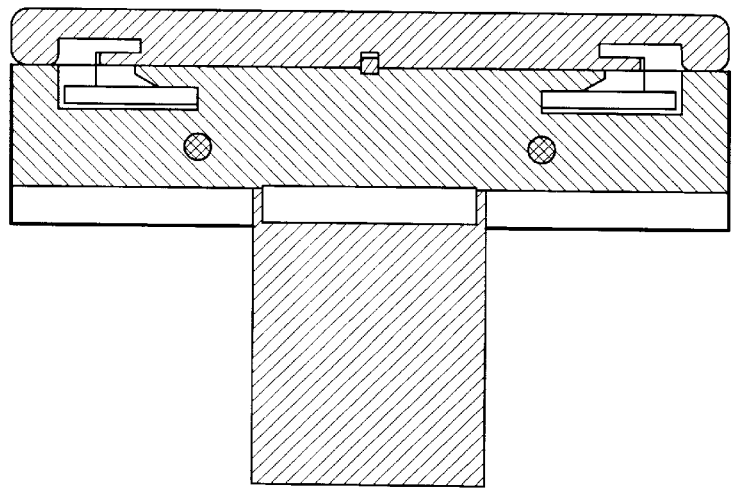
FIG. 4(B) is a sectional view showing a cross section of the type coupling component of FIG. 4(A) attaching the plate and the heating block.

FIG. 4 illustrates an example of a variation for a coupling component. FIG. 4 (A) shows a cross section of a variation example of a susceptor device according to this invention and FIG. 4(B) shows how a susceptor plate and a heating block are linked.

A coupling component in a variation example according to this invention is a pawl portion having a substantially U-shaped sectional view, and preferably comprising nickel (Ni) alloy containing chrome (Cr), but a material such as cobalt-nickel (Co—Ni) alloy with excellent heat resistance and corrosion resistance can be used. The coupling component (40) comprises a base (41) and a hook (43). The base (41) is contacted with and inserted to the inside surface of a recessed portion (28) of a heating block (21). Preferably, to make inserting of the base easier, the corners of the undersurface (35) of the pawl portion (29) of a heating block (21) are planed off (42).

Where this coupling component (40) is largely different from the coupling component (30) is that it is inserted into the heating block side, not into the susceptor plate side. A method to link a susceptor plate (20) and a heating block (21) is the same as that of the preferable implementation example.

Variation of Plate; Radio frequency Grounded Electrode

Figure 5:
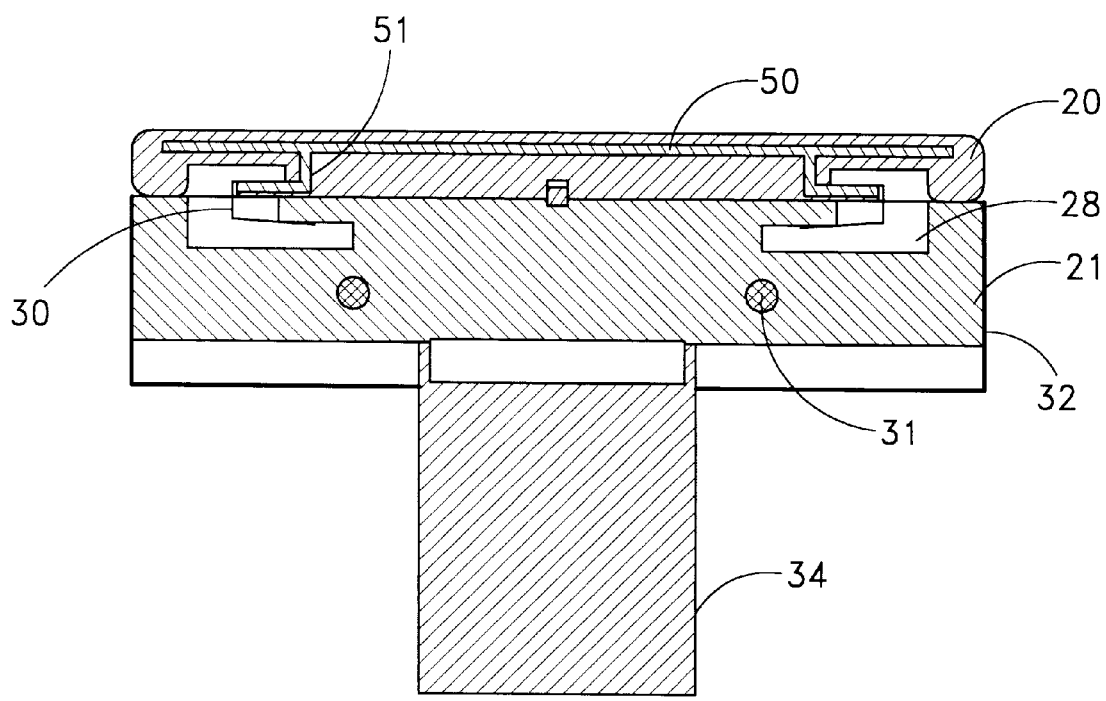
FIG. 5 is a sectional view showing a cross section of another type susceptor device according to an embodiment of the present invention.

FIG. 5 illustrates a cross section of another implementation example of a susceptor device according to this invention. A susceptor plate (20') comprises aluminum nitride, which is a ceramic material, and a radio frequency grounded electrode (50) is embedded in it. For an aluminum nitride substrate (20'), preferably sintered aluminum nitride of more than 99% purity and more than 80 Wm-1K-1 heat conductivity is used. Further, if a susceptor plate (20) of aluminum alloy in the preferable implementation example is used for a susceptor plate (20'), embedding a radio frequency grounded electrode is not necessary because the plate itself functions as a radio frequency grounded electrode.

For a radio frequency grounded electrode, preferably molybdenum with a disc shape of about 0.1 mm thick is used, but in addition, molybdenum foil, molybdenum with multiple openings, printed molybdenum film, or molybdenum mesh can also be used. Moreover, tungsten can be used in addition to molybdenum.

Within the plate (20'), a thin cylindrical metal layer (51) is provided and it electrically connects a radio frequency grounded electrode (50) and a coupling component (30). As a result, a radio frequency grounded electrode (50) is grounded through the coupling component (30) and the heating block (21). For a metal layer (51), preferably nickel is used, but additionally, molybdenum or titan can be used. The metal layer (51) can be formed by plating, non-electrolytic plating, evaporating or screen-printing the surface of an aluminum nitride substrate (20').

Because the conditions other than those mentioned in the above and a method to link a susceptor plate (20') and a heating block (21) are the same as explained for the preferable implementation example, explanation is omitted.

Second Embodiment

On the other hand, another susceptor device to support a semiconductor substrate within a semiconductor-processing device according to this invention comprises a plate for the semiconductor substrate is placed, the surface of which is a substantially flat carrying surface with a through-hole and the back of which has at least one protruding pawl portion, a heating block used to heat the semiconductor substrate, which has an embedded heating element, and has at least one recessed portion with a pawl portion and one through-hole on the surface, a coupling component that is inserted into the recessed portion of the heating block and has a through-hole to secure the pawl portion of the plate and the pawl portion of the heating block tightly together by gripping both, a shaft material that seals off through-holes by passing through a through-hole of the plate, a through-hole of the coupling component and a through-hole of the heating block, which are aligned coaxially, and a shielding material to accommodate the heating block. The device is characterized by the back of the plate and the surface of the heating block adhering tightly together.

Figure 6:
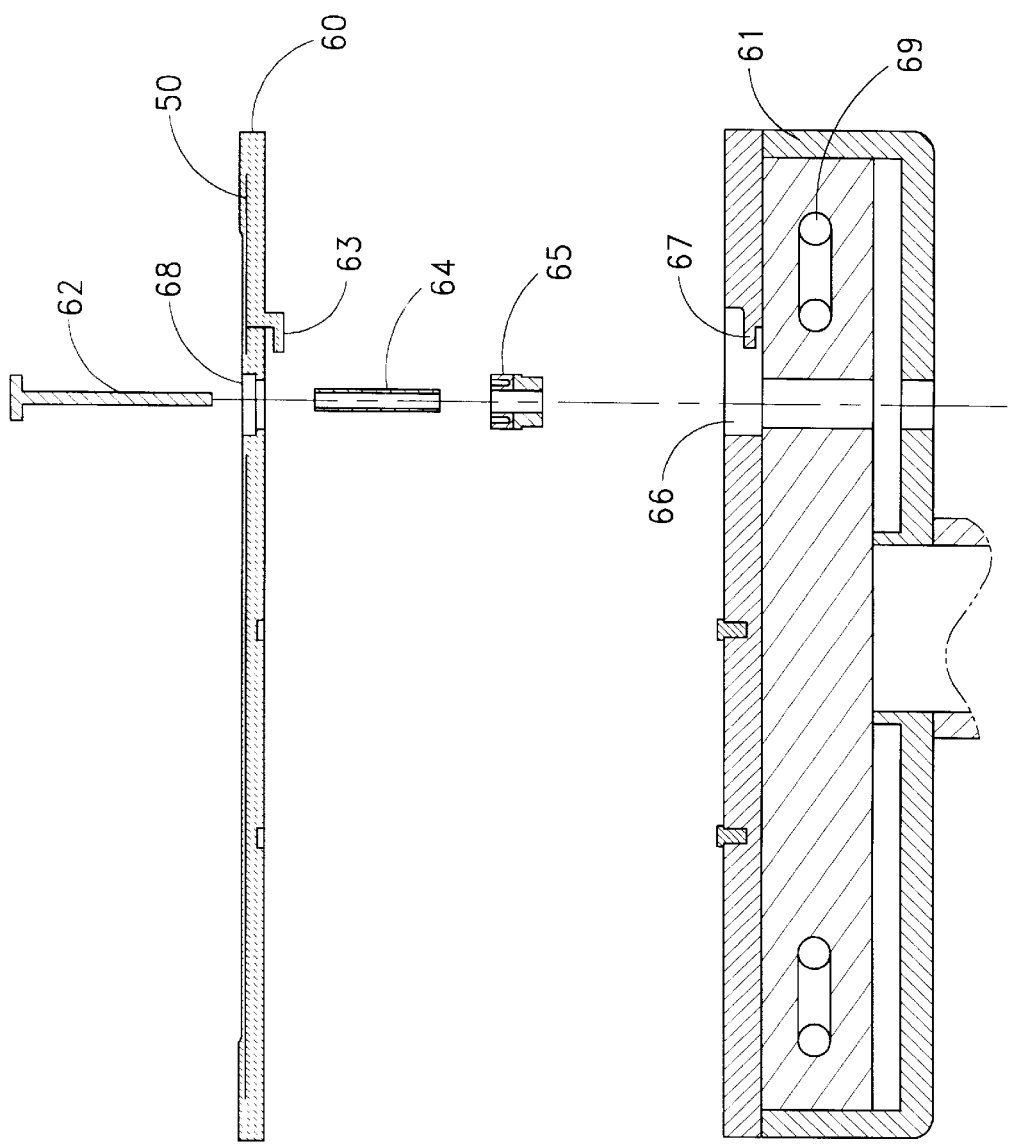
FIG. 6 is a sectional view showing a disassembled susceptor according to another embodiment of the present invention.
Figure 11:
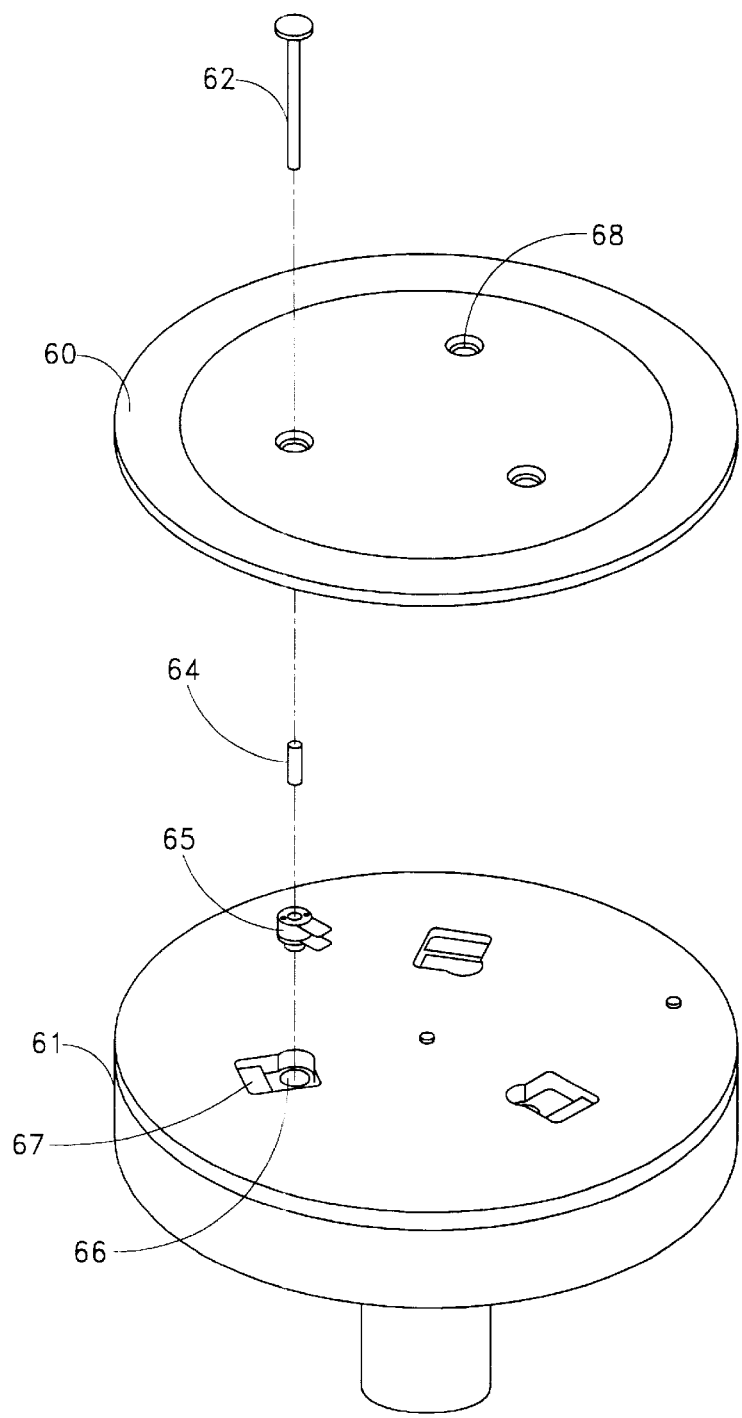
FIG. 11 is a perspective view showing a disassembled susceptor device according to an embodiment of the present invention.

FIG. 6 roughly illustrates a vertical cross section with parts dismantled for another susceptor device according to this invention. FIG. 11 illustrates a view at a perpendicular cross section with parts dismantled for another susceptor device according to this invention. The plate (60) comprises aluminum nitride, which is a ceramic material, and an embedded radio frequency grounded electrode (50). As shown in FIG. 11, on the substantially flat surface of the plate (60), three round through-holes (68) are provided. Here, as with the recessed portions indicated in FIG. 2, for example, it is possible to provide more than four through-holes. On the back surface of the plate (60), a protruding pawl portion (63) is provided. Other conditions of the plate (60) are the same as those for the plate (20') in the implementation example.

Within the heating block, a heater (69) to heat a semiconductor substrate is embedded. Moreover, on the surface, a recessed portion (66) that is connected to a through-hole is provided. From one part within the recessed portion (66), a pawl portion (67) extending parallel to the surface of the heating block (61) is provided. Other conditions of the heating block (61) are the same as those for the heating block (21) in the implementation example.

Within the through-hole (66) of the heating block (61), a coupling component (65) is installed, and within the through-hole (70) (See FIG. 7) of the coupling component (65), a guide (64) is inserted. A plate (60) is then placed upon proper alignment. As explained in detail later, the coupling component (65) secures the plate (60) and the heating block (61) and, lastly, a shaft (62) comprised of a heat-resistant and corrosion-resistant material seals off the through-hole (68) by passing through the guide (64).

Figure 7C:
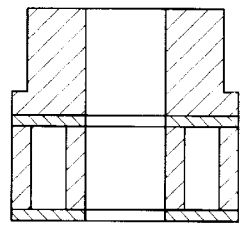
FIG. 7(C) is a side sectional view of the coupling component of FIG. 7(A).
Figure 7A:
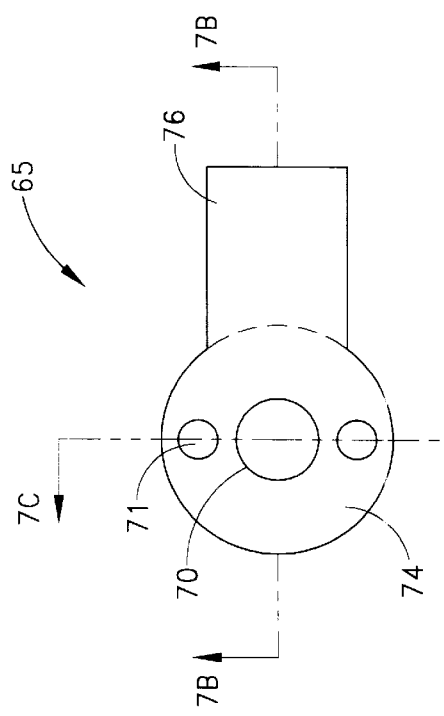
FIG. 7(A) is a plane view of a coupling component used in a susceptor device according to an embodiment of the present invention.
Figure 7B:
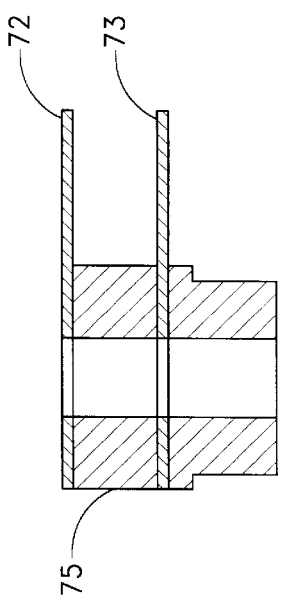
FIG. 7(B) is a front sectional view of the coupling component of FIG. 7(A).

FIGS. 7 shows an enlarged view of the coupling component (65) in FIG. 6. FIG. 7(A) is a ground plan, FIG. 7(B) is a B—B cross section of FIG. 7(A) and FIG. 7(C) is a C—C cross section of FIG. 7(A). Different from the coupling component (30) or (40), the coupling component (65) is a pawl with a substantially F-shaped cross section, which comprises two parallel flat springs (72) and (73) and a block (75). An interval between two flat springs (72) and (73) is pre-set in relation to coupling and securing of the plate (60) and the heating block (61), which is explained in detail later. The coupling component (65) comprises a circular part (74) and a stretching part (76) extending from the circumference. A through-hole (70) is provided at the center of the circular part (74), and two holes (71) with an axis parallel to the axis of the through-hole (70) are provided on the surface of the circular part. Flat springs (72) and (73) can be secured to the block (75) by spot welding or by conventional welding methods such as TIG welding. The coupling component (65) comprises preferably nickel (Ni) alloy containing chrome (Cr), but a material such as cobalt-nickel (Co—Ni) alloy with excellent heat resistance and corrosion resistance can be used. The guide (64) and the shaft (62) can be made of the same material as the coupling component (65).

Figure 8A:
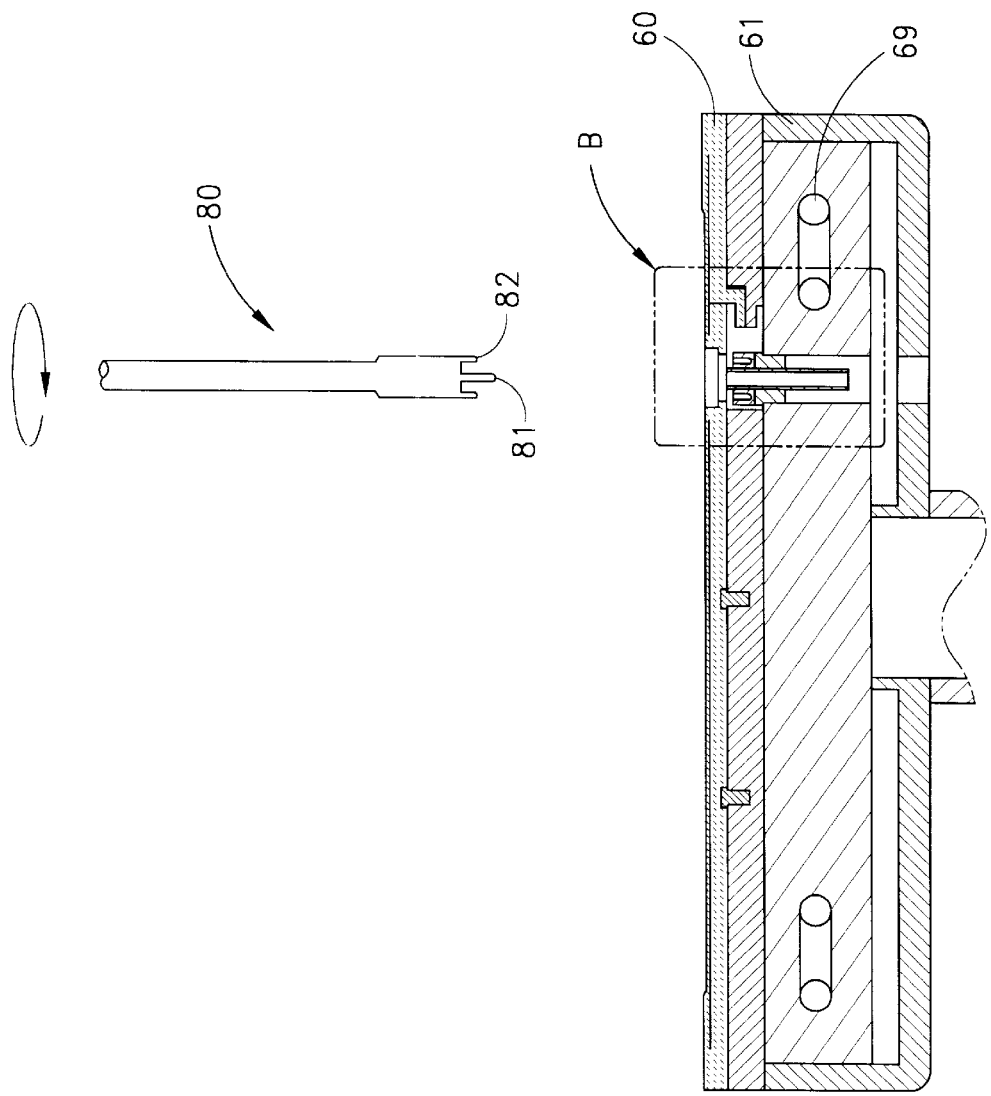
FIG. 8(A) is a sectional view showing a coupling component inserted in a susceptor and an attachment for rotating the coupling component according to an embodiment of the present invention.

FIG. 8 illustrates how the plate (60) and the heating block (61) are linked by the coupling component (65). FIG. 8(A) illustrates that the coupling component (65), the guide (64) and the plate (60), which are aligned in such a way that the axis of each through-hole aligns, are fitted into the through-hole (66) of the heating block in this order. While maintaining the configurations indicated in FIG. 8(A), the plate (60) and the heating block (61) are secured tightly together by rotating only the coupling component (65) using an attachment (80).

Figure 8B:
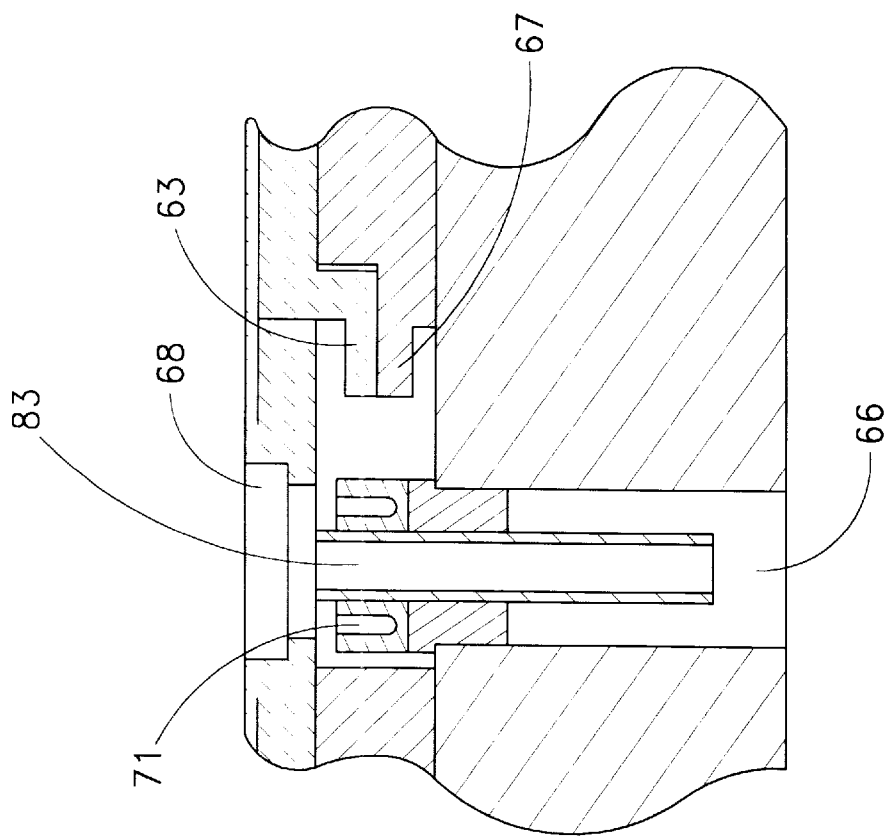
FIG. 8(B) is an enlarged sectional view showing the coupling component of FIG. 8(A).

FIG. 8(B) is a partially enlarged illustration of FIG. 8(A). At the tip of the attachment (80), a protruding part (81) at the center and two small protruding parts (82) surrounding it are provided. Passing through the through-hole (68) of the plate (60), the attachment (80) is slowly advanced toward the coupling component (65). The protruding part (81) of the attachment (80) is inserted into the opening (83) of the guide, and two small protruding parts (82) are inserted into two holes (71) of the coupling component. Next, the attachment (80) is manually rotated.

Figure 9B:
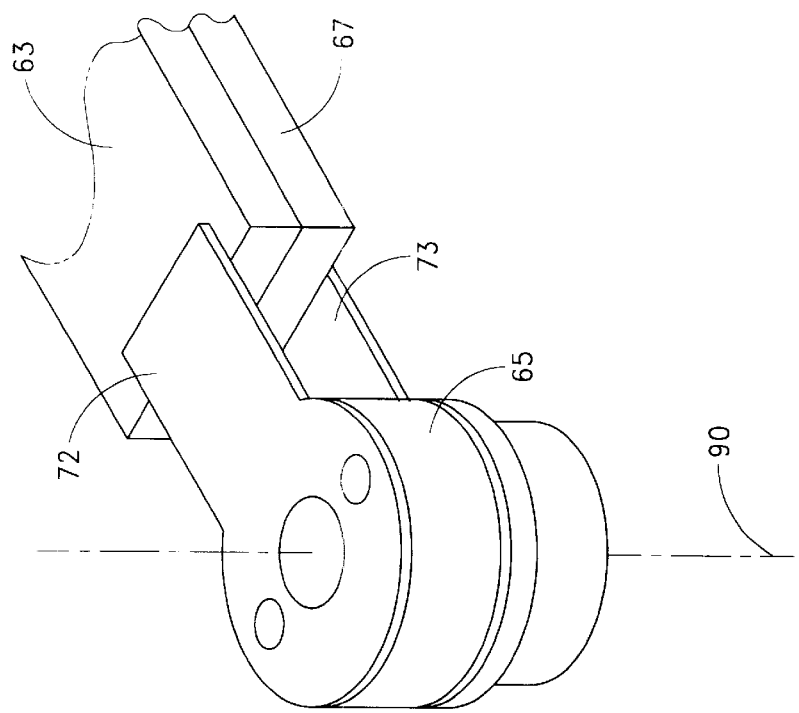
FIG. 9(B) is a perspective view showing the coupling component gripping the pawls illustrated in FIG. 9(A).
Figure 9A:
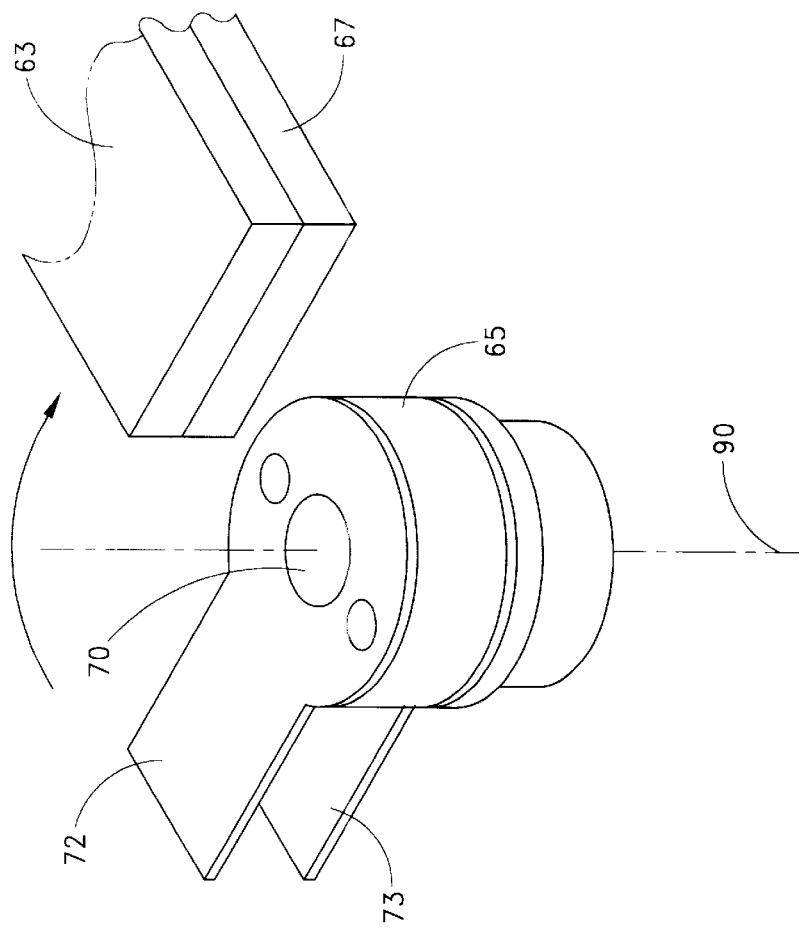
FIG. 9(A) is a perspective view showing a coupling component adapted to grip pawls provided in a heating block according to an embodiment of the present invention.

FIG. 9 is an enlarged view of how the coupling component (65) is rotated by the attachment (80). With the coupling component (65) being rotated by 90 degrees around the axis (90), two flat springs (72) and (73) grip the pawl portion (63) of the plate (60) and the pawl portion (67) of the heating block. In this way, the plate (60) and the heating block (61) are secured tightly together. At this time, it is preferable for an interval between two flat springs (72) and (73) to be equal to the sum of the thickness of both pawl portions (63) and (67) or to be slightly narrower than that.

By connecting the coupling component (65), a radio frequency grounded electrode (50) is grounded through the coupling component (65) and the heating block (61).

Figure 10:
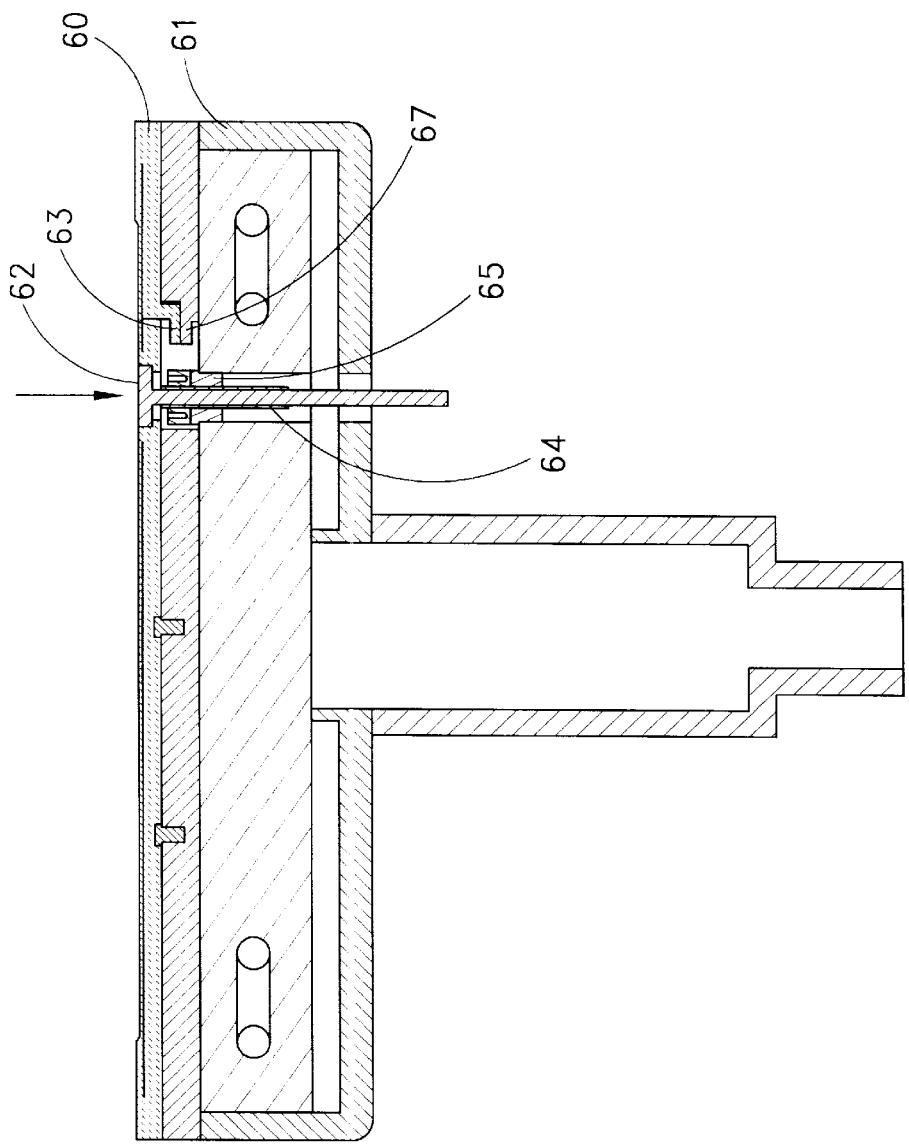
FIG. 10 is a sectional view showing a cross section of a susceptor device according to an embodiment of the present invention.

FIG. 10 illustrates a cross section of a susceptor device after a through-hole (68) of a plate (60) has been sealed off with a shaft (62). The head part of the shaft is formed in such a way that it can be inserted into the through-hole (68) of the plate. When the shaft is inserted, the through-hole of the susceptor is completely sealed off, so there is no risk of contamination by the intrusion of etching gas. Moreover, the shaft (62) is used to form a space in order to insert an arm for conveying use by lifting a semiconductor substrate from the susceptor surface, but because friction caused at the time of carrying the shaft (62) in and out is prevented by the guide (64), there is no concern about particle contamination from there.

The above-mentioned operation is performed respectively for all three through-holes of the plate (60), but if at least one hole is fastened completely, it is possible practically to secure the plate (60) and the heating block (61) tightly together.

Basic Effects

As described above, according to an embodiment of a susceptor device, a susceptor plate can be dismantled and remounted very easily within a short time and time required for maintenance can be significantly shortened, hence productivity is improved.

Moreover, according to another embodiment of a susceptor device, because it does not use any bolts, there is no concern about looseness of bolts, particle contamination, and damage caused by different coefficients of thermal expansion. In addition, according to yet another embodiment of a susceptor device, even if a discrepancy in dimensions occurs due to thermal expansion between a susceptor and a heating block, adherence of the susceptor and the heating block is always maintained, because of the spring prevents a vertical opening caused by thermal expansion.

Furthermore, according to another embodiment, a susceptor with low manufacturing costs can be provided.

Various Preferable Embodiments

As explained above, the present inventions includes various embodiments as follows:

1) A supporting device for supporting a semiconductor substrate within a semiconductor-processing device comprises a plate on which the semiconductor substrate is placed, the surface of which is a substantially flat carrying surface and the back of which has at least one recessed portion with a pawl portion formed, a heating block used to heat the semiconductor substrate, and which has an embedded heating element and which has at least one recessed portion with a pawl portion formed on the surface, a coupling component that is inserted into the recessed portion of the plate or the heating block and is used to secure the pawl portion of the plate and the pawl portion of the heating block tightly together by gripping both, and a shielding material to accommodate the heating block, and which supporting device is characterized by the back of the plate and the surface of the heating block are secured tightly by rotating the plate.

2) Preferably, in an embodiment, the coupling component is a heat-resistant and corrosion-resistant pawl with a U-shaped cross section.

3) Also preferably, in another embodiment, the plate is comprised of aluminum alloy or aluminum nitride.

4) In addition, a radio frequency grounded electrode can also be embedded in the plate comprised of the aluminum nitride.

5) More preferably, in another embodiment, the radio frequency grounded electrode is electrically connected to the heating block via the coupling component.

6) A supporting device for supporting a semiconductor substrate within a semiconductor-processing device comprises a plate on which the semiconductor substrate is placed, the surface of which is a substantially flat carrying surface with a through-hole, and the back of which has at least one protruding pawl portion, a heating block used to heat the semiconductor substrate, which has an embedded heating element, and has at least one recessed portion with a pawl portion and one through-hole on the surface, a coupling component that is inserted into the recessed portion of the heating block and has a through-hole to secure the pawl portion of the plate and the pawl portion of the heating block together tightly by gripping both, a shaft material that seals off through-holes by passing through a through-hole of the plate, a through-hole of the coupling component and a through-hole of the heating block, which are aligned coaxially, and a shielding material to accommodate the heating block, and wherein the back of the plate and the surface of the heating block adhere together tightly.

7) In the above, the pawl portion of the plate can be a recessed portion instead of a projecting portion. This embodiment can work as in embodiment (1).

8) In practice, the coupling component may be a heat-resistant and corrosion-resistant material with an F-shaped section, which is axially rotatable, and is a material that has at least one hole with an axis parallel to the rotating direction.

9) Preferably, in an embodiment, the coupling component grips the pawl portions of the plate and the heating block and secures both tightly together by manually rotating the coupling component around the rotating axis.

10) Further, preferably, in another embodiment, the plate is comprised of aluminum alloy or aluminum nitride.

11) Additionally, a radio frequency grounded electrode can also be embedded in the plate comprised of the aluminum nitride.

12) Also preferably, in an embodiment, the radio frequency grounded electrode is electrically connected to the heating block via the coupling component.

13) Further preferably, in yet another embodiment, a guide is inserted between the through-holes and the shaft.

14) In the above, the coupling component can be omitted, and the plate and the heating block can be fixed directly by engaging the pawls formed in such a way that the pawls are engaged when one of them is rotated in a manner of a screw fastener or a screw thread.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A supporting structure of a susceptor for semiconductor processing, comprising:

a plate having a carrying surface for placing a semiconductor substrate thereon, said plate having a back surface comprising at least one first coupling structure with a first pawl; and a heating block for heating the semiconductor substrate, said heating block having an upper surface in contact with the back surface of the plate, said upper surface comprising at least one second coupling structure with a second pawl corresponding to said at least one first coupling structure with the first pawl, wherein said first pawl and said second pawl are in pressure contact to couple the plate and the heating block.

2. The supporting structure according to claim 1, wherein each first coupling structure is a recessed portion formed on the back surface of the plate, each first pawl is formed in the recessed portion, each second coupling structure is a recessed portion formed on the upper surface of the heating block, and each second pawl is formed in the recessed portion.

3. The supporting structure according to claim 2, further comprising a coupler for gripping each pair of the first pawl and the second pawl to couple the plate and the heating block.

4. The supporting structure according to claim 3, wherein said coupler is fixed in either the first coupling structure or the second coupling structure, and has a hook for engaging the pawl of the other coupling structure.

5. The supporting structure according to claim 4, wherein the hook engages the pawl when inserting the hook into said other coupling structure to contact the plate and the heating block and then turning the plate.

6. The supporting structure according to claim 2, wherein a radio frequency grounded electrode is embedded in the plate, and said radio frequency grounded electrode is electrically connected to the heating block via a coupler.

7. The supporting structure according to claim 1, wherein each first coupling structure is a protruding portion formed on the back surface of the plate, said protruding portion forms the first pawl, each second coupling structure is a recessed portion formed on the upper surface of the heating block, and each second pawl is formed in the recessed portion.

8. The supporting structure according to claim 7, further comprising a coupler for gripping each pair of the first pawl and the second pawl to couple the plate and the heating block.

9. The supporting structure according to claim 8, wherein said coupler is axially rotatable and has two hooks to grip each pair of the first pawl and the second pawl.

10. The supporting structure according to claim 9, wherein said coupler has a through-hole in the axial direction and is rotatably placed in the recessed portion of the second coupling structure, the plate has a through-hole aligned coaxially with said coupler, and the heating block has a through-hole aligned coaxially with said coupler, said structure further comprising a shaft passing through said through-hole of the plate, said through-hole of the coupler, and said through-hole of the heating block, said shaft having a head which seals off said through-hole of the plate.

11. The supporting structure according to claim 10, wherein said coupler is manually rotatable prior to placing the shaft through said through-hole of the plate.

12. The support structure according to claim 10, further comprising a guide inserted between said through-holes and said shaft.

13. A supporting device for supporting a semiconductor substrate for semiconductor processing, comprising:
   a plate having a carrying surface for placing the semiconductor substrate thereon, said plate having a back surface having at least one recessed portion with a pawl formed on the back surface;
   a heating block for heating the semiconductor substrate, said heating block having an upper surface having at least one recessed portion with a pawl formed on the upper surface; and
   a coupler inserted into said recessed portion of said plate or said heating block, for securing said pawl of said plate and said pawl of said heating block together by gripping both, wherein said plate and said heating block are fixed by rotating said plate.

14. The device according to claim 13, wherein said coupler is a heat-resistant and corrosion-resistant clip with a U-shaped cross section.

15. The device according to claim 13, wherein said plate is comprised of aluminum alloy or aluminum nitride.

16. The device according to claim 15, further comprising a radio frequency grounded electrode embedded in the plate.

17. The device according to claim 16, wherein said radio frequency grounded electrode is electrically connected to said heating block via said coupler.

18. A supporting device for supporting a semiconductor substrate for semiconductor processing, comprising:
   a plate having a carrying surface for placing the semiconductor substrate thereon, said carrying surface having at least one through-hole, said plate having a back surface having at least one protruding pawl portion;
   a heating block for heating the semiconductor substrate, said heating block having an upper surface having at least one recessed portion with a pawl and one through-hole on the upper surface;
   a coupler inserted into said recessed portion of said heating block for securing said pawl portion of said plate and said pawl of said heating block together by gripping both, said coupler having a through-hole; and
   a shaft for sealing off said through-hole of said plate and passing through said through-hole of said plate, said through-hole of the coupler, and said through-hole of said heating block, which are aligned coaxially; wherein said plate and said heating block are fixed by rotating said coupler.

19. The device according to claim 18, wherein said coupler is a heat-resistant and corrosion-resistant material with an F-shaped cross section, which is axially rotatable and has at least one hole with an axis parallel to the rotating direction.

20. The device according to claim 18, wherein said plate is comprised of aluminum alloy or aluminum nitride.

21. The device according to claim 20, further comprising a radio frequency grounded electrode is embedded in said plate.

22. The device according to claim 21, wherein said radio frequency grounded electrode is electrically connected to said heating block via said coupler.

23. The device according to claim 18, further comprising a guide inserted between said through-holes and said shaft.

* * * * *